United States Patent
Huang et al.

[11] Patent Number: 6,080,658
[45] Date of Patent: Jun. 27, 2000

[54] DEVICE PROTECTION STRUCTURE FOR PREVENTING PLASMA CHARGING DAMAGE AND VERTICAL CROSS TALK

[75] Inventors: Lu-Shiang Huang; Kuan-Yu Fu, both of Hsinchu, Taiwan

[73] Assignee: United Microelectronics Corp., Hsinchu, Taiwan

[21] Appl. No.: 09/151,061

[22] Filed: Sep. 10, 1998

[30] Foreign Application Priority Data

Jul. 1, 1998 [TW] Taiwan .................................. 87110624

[51] Int. Cl.[7] ..................... H01L 21/4763; H01L 21/311; H01L 21/302
[52] U.S. Cl. .......................... 438/629; 438/637; 438/639; 438/640; 438/700; 438/739
[58] Field of Search .................................. 438/629, 637, 438/639, 640, 700, 739

[56] References Cited

U.S. PATENT DOCUMENTS 5,565,372 10/1996 Kim .
5,631,179 5/1997 Sung et al. .
5,899,749 5/1999 Becker et al. .
5,972,804 10/1999 Tobin et al. .

*Primary Examiner*—John F. Niebling
*Assistant Examiner*—Ron Pompey
*Attorney, Agent, or Firm*—Thomas, Kayden, Horstemeyer & Risley

[57] ABSTRACT

A device manufacturing method prevents damage from plasma charging and vertical cross talk. The method comprises the steps of forming an insulating layer over a substrate that has a MOS device and source/drain regions already formed thereon. The insulating layer is formed by a non-plasma operation so that plasma damage is avoided. Thereafter, a conductive layer is formed over the substrate. The conductive layer is used to channel away excess charges produced during subsequent plasma operations, thereby balancing electric potential and preventing damage to the device from current flow. Subsequently, an inter-layer dielectric layer is formed over the conductive layer, and then the inter-layer dielectric layer, the conductive layer and the insulating layer are patterned to form an opening that exposes the source/drain region. Finally, a conventional method is used to form another insulating layer over the exposed conductive layer in order to prevent direct contact with subsequently formed metallic contacts inside the opening.

6 Claims, 4 Drawing Sheets

DEVICE PROTECTION STRUCTURE FOR PREVENTING PLASMA CHARGING DAMAGE AND VERTICAL CROSS TALK

CROSS-REFERENCE TO RELATED APPLICATION

This application claims the priority benefit of Taiwan application serial no. 87110624, filed Jul. 1, 1998, the full disclosure of which is incorporated herein by reference.

BACKGROUND OF THE INVENTION

1. Field of Invention

The present invention relates to a device protection structure for preventing plasma charging damage and vertical cross talk, and the method of manufacturing such a structure. More particularly, the present invention relates to a device protection structure capable of preventing device damage due to plasma during fabrication as well as vertical cross talk between neighboring metallic layers and the method of manufacturing such a structure.

2. Description of Related Art

Current semiconductor processing relies heavily on plasma operations. Because sufficient energy is transferred to the plasma when ions are accelerated in an intense electric field, bombarding ions have a specific directionality on a target electrode. Hence, plasma is an important element in sputtering and dry etching operations. Therefore, plasma is commonly employed, for example, in plasma-enhanced chemical vapor deposition (PECVD), high-density plasma chemical vapor deposition (HDPCVD), reactive ion etching (RIE) and anisotropic etching.

However, since highly energetic ions are generated in a plasma operation, electric charges produced by the plasma are capable of damaging the semiconductor device structure. Therefore, a diode is normally formed and connected to the metallic line in a circuit layout as shown in FIG. 1. FIG. 1 is a circuit outline showing a conventional protection device for preventing damage due to plasma charging. In FIG. 1, the gate 102 of a MOS field effect transistor 100 is connected to a metal contact 106 by a polysilicon line 104. The metal contact 106 is connected to another metal contact 110 via a metal line 108. The metal contact 110 is in contact with a diode 112. Excessive charges produced in plasma operations are conducted away by the diode 112, via the metal line 108 and other conductive layers. However, after the polysilicon line 104 is formed but before the metal line 108 is connected, there is no conductive pathway to channel away excessive electric charges produced by plasma operations. Consequently, devices may be damaged, which leads to a lowering of product yield.

Furthermore, as shown in FIG. 1, metal line 108 and another metal line 116 are normally connected via a dielectric opening 114. In the conventional processing operation, no specific structures are formed for preventing cross talk between metal lines 108 and 116, or cross talk between multiple conductive lines. Hence, a device is often functionally deficient leading to abnormal operation.

In light of the foregoing, there is a need to provide a device protection structure for reducing damage due to plasma and vertical cross talk between separate metallic lines.

SUMMARY OF THE INVENTION

Accordingly, the present invention provides a device manufacturing method capable preventing damage due to plasma charging in a plasma operation.

In another aspect, this invention provides a device structure capable of preventing vertical cross talk between different metallic layers so that the device is more efficient.

To achieve these and other advantages and in accordance with the purpose of the invention, as embodied and broadly described herein, the invention provides a device manufacturing method capable of preventing damage due to plasma charging. The method comprises the steps of forming an insulating layer over a substrate that has a MOS device and source/drain regions already formed thereon. The insulating layer is formed by a non-plasma operation so that plasma damage is avoided. Thereafter, a conductive layer is formed over the substrate. The conductive layer is used to channel away excess charges produced during subsequent plasma operations, thereby balancing electric potential and preventing damage to the device through current flow. Subsequently, an inter-layer dielectric layer is formed over the conductive layer, and then the inter-layer dielectric layer, the conductive layer and the insulating layer are patterned to form an opening that exposes the source/drain region. Finally, conventional method is used to form another insulating layer over the exposed conductive layer in order to prevent direct contact with subsequently formed metallic contact inside the opening.

The invention also provides a structure capable of preventing vertical cross talk between different metallic layers. The structure comprises: a substrate having at least a device that includes a doped region; a first dielectric layer over the substrate; a first conductive layer within the first dielectric layer and above but not in contact with the device, wherein the first conductive layer is used for preventing damage caused by electric charges; a metallic contact connected to the doped region but isolated from the first conductive layer through the first dielectric layer; a second dielectric layer covering the metallic contact; a first metallic layer above the second dielectric layer; and a second conductive layer within the second dielectric layer and between the metallic contact/first metallic layer and a second metallic layer but having no direct contact with the metallic contact or the first or second metallic layers, and that the second conductive layer is used for preventing vertical cross talk between the metallic contact/first metallic layer and the second metallic layer.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
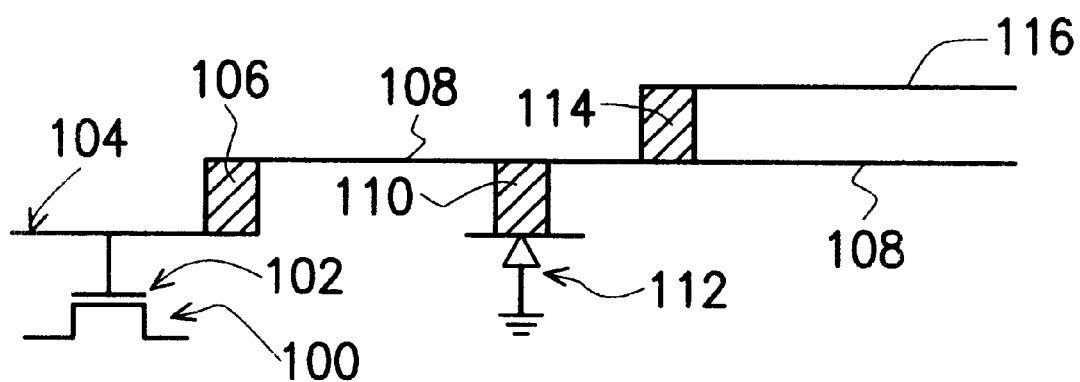
FIG. 1 is a circuit outline showing a conventional protection device for preventing damage due to plasma charging.

Reference will now be made in detail to the present preferred embodiments of the invention, examples of which are illustrated in the accompanying drawings. Wherever possible, the same reference numbers are used in the drawings and the description to refer to the same or like parts.

The invention provides a device manufacturing method capable of preventing damage due to plasma charging. The method comprises the steps of forming an insulating layer over a substrate that has a MOS device and source/drain regions already formed thereon. The insulating layer is formed by a non-plasma operation so that plasma damage is avoided.

Thereafter, a conductive layer is formed over the substrate. The conductive layer is used to channel away excess charges produced during a subsequent plasma operation, thereby balancing electric potential and preventing damage to the device through current flowing due to a voltage difference. Subsequently, an inter-layer dielectric layer is formed over the conductive layer, and then the inter-layer dielectric layer, the conductive layer and the insulating layer are patterned to form an opening that exposes the source/drain region. Finally, another insulating layer is formed using a conventional method to cover the exposed conductive layer in order to prevent contact with subsequently formed metallic contact inside the opening.

Furthermore, in order to avoid vertical cross talk between different metallic layers, an additional conductive layer is formed between different metallic layers. The conductive layer does not have any direct contact with the metallic layer above or below, or any other conductive layers. The added conductive layer shields against electrical signals coming from both the upper and the lower metallic layers, and hence reduces the severity of cross talk between them.

Figure 2A:
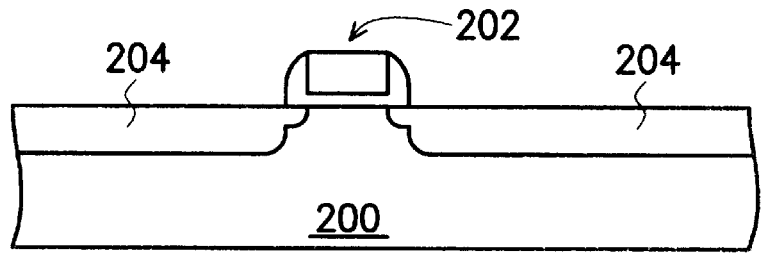
FIGS. 2A through 2D are cross-sectional views showing the progression of manufacturing steps in producing a device capable of preventing damage due to plasma charging according to a first embodiment of this invention.
Figure 2B:
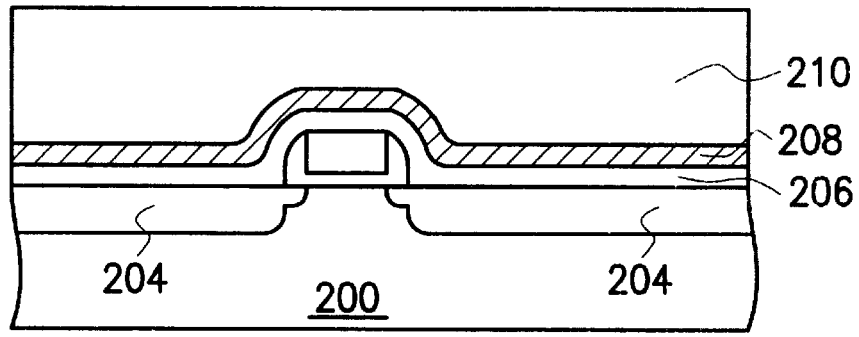

FIGS. 2A through 2D are cross-sectional views showing the progression of manufacturing steps in production of a device capable of preventing damage due to plasma charging according to a first embodiment of this invention. First, as shown in FIG. 2A, a MOS field effect transistor 202 having doped regions 204, for example, is formed on a substrate 200. Next, an insulating layer 206 is formed over the substrate 200 as shown in FIG. 2B. The insulating layer 206 is formed using a non-plasma operation. The insulating layer is formed using, for example, an atmospheric pressure chemical vapor deposition (APCVD) method.

Thereafter, a conductive layer 208 is formed over the insulating layer 206. The conductive layer 208 includes a metallic layer. In the subsequent step, an inter-layer dielectric (ILD) layer 210 is formed over the conductive layer 208. The ILD layer 210 can be formed using a chemical vapor deposition method that includes the use of plasma.

Figure 2C:
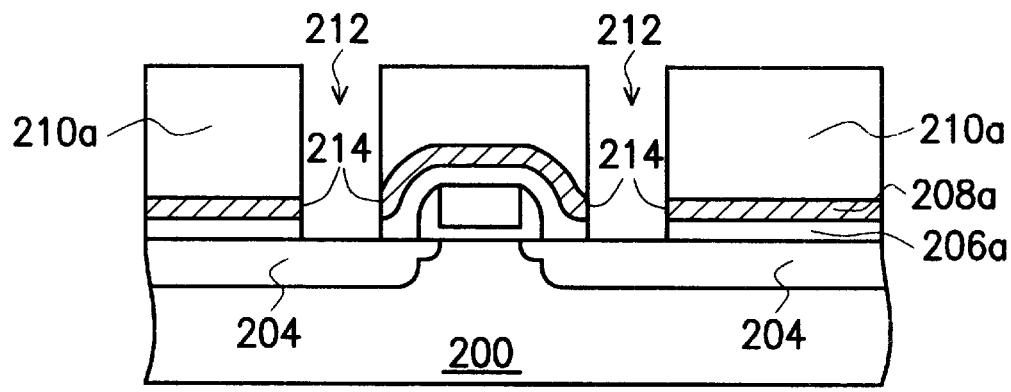

Next, as shown in FIG. 2C, the ILD layer 210a, the conductive layer 208a and the insulating layer 206a are patterned to form contact openings 212 using, for example, a dry etching method. Besides exposing the doped region 204, the contact opening 212 also exposes sidewalls 214 of the conductive layer. Consequently, excessive electric charges produced during plasma operations (for example, PECVD or HDPCVD for forming the ILD layer 210) and dry etching operations can be conducted away through the conductive layer 208 to balance the electric potential. Hence, damages resulting from current flowing down a potential gradient can be avoided.

Figure 2D:
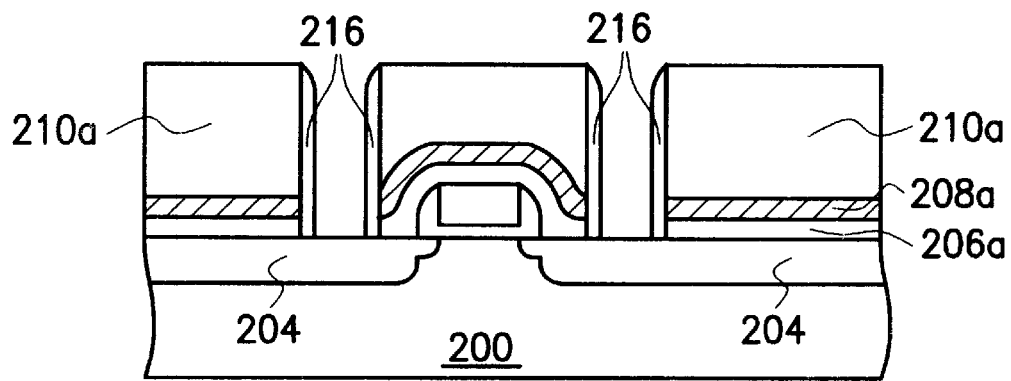

Next, in order to avoid contact of conductive material subsequently deposited inside the contact opening 212 with the conductive layer 208a on the sidewalls 214, insulating spacers 216 are formed over the sidewalls 214 as shown in FIG. 2D. Finally, a conventional method is used to deposit conductive material into the contact opening 212, thereby forming a conductive layer that couples electrically with the doped region 204.

Figure 3A:
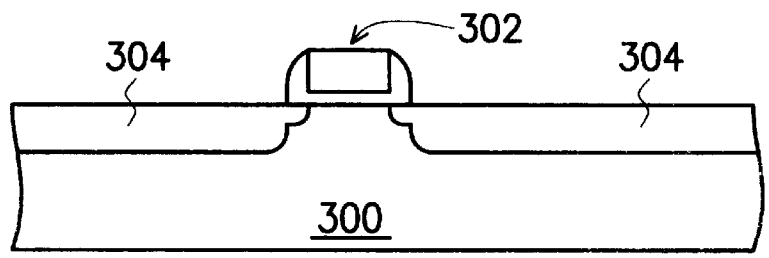
FIGS. 3A through 3D are cross-sectional views showing the progression of manufacturing steps in producing a device capable of preventing damage due to plasma charging according to a second embodiment of this invention.
Figure 3B:
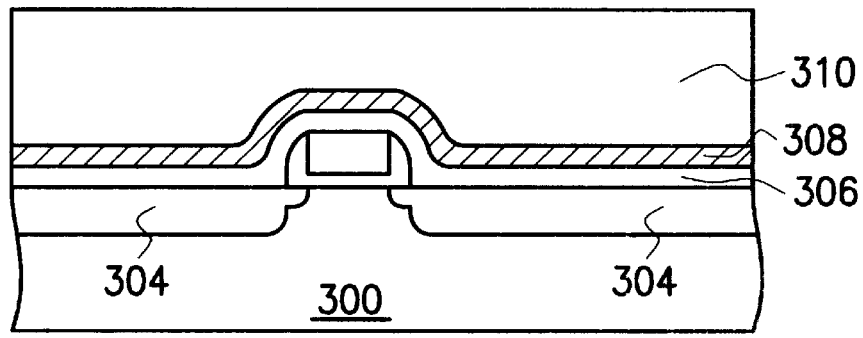

FIGS. 3A through 3D are cross-sectional views showing the progression of manufacturing steps in production of a device capable of preventing damage due to plasma charging according to a second embodiment of this invention. First, as shown in FIG. 3A, a MOS field effect transistor 302 having doped regions 304, for example, is formed on a substrate 300. Next, an insulating layer 306 is formed over the substrate 300 as shown in FIG. 3B. The insulating layer 306 is formed using a non-plasma operation, for example, an atmospheric pressure chemical vapor deposition (APCVD) method. Thereafter, a conductive layer 308 is formed over the insulating layer 306. The conductive layer 308 includes a metallic layer. In the subsequent step, an interlayer dielectric (ILD) layer 310 is formed over the conductive layer 308. The ILD layer 310 can be formed using a chemical vapor deposition method that includes the use of plasma.

Figure 3C:
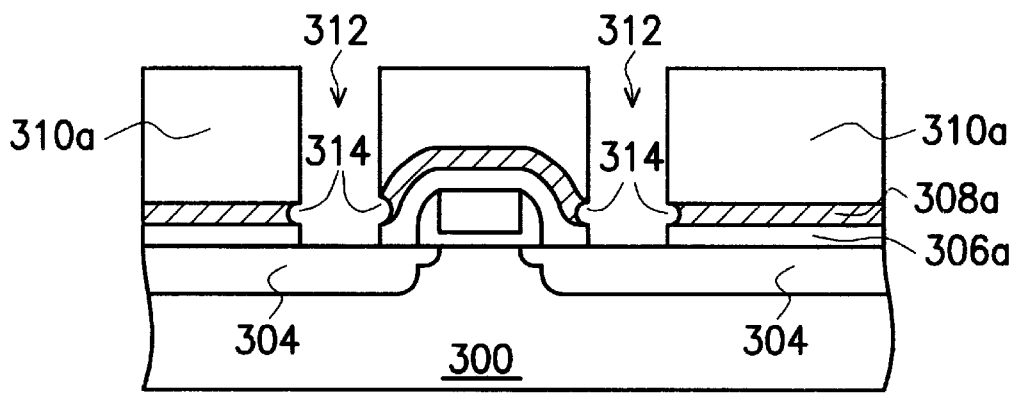

Next, as shown in FIG. 3C, a contact opening 312 is formed by first etching the ILD layer 310a anisotropically, and then etching the conductive layer 308a isotropically, and finally etching the insulating layer 306a anisotropically. The contact opening 312 exposes the doped region 304. Alternately, the contact opening 312 is formed by first etching the ILD layer 310a, the conductive layer 308a and the insulating layer 306a anisotropically, and then etching the conductive layer 308a isotropically.

In the aforementioned alternate method, a recessed cavity 314 will form on each sidewall of the contact opening 312 when the conductive layer 308a is isotropically etched, thereby exposing a portion of the conductive layer 308a. The conductive layer 308a exposed by the recessed cavities 314 is capable of channeling away excessive electric charges produced during plasma operations (for example, PECVD or HDPCVD for forming the ILD layer 310) and dry etching operation. Hence, the electric potential is balanced and damages resulting from current flowing down a potential gradient are greatly minimized.

Figure 3D:
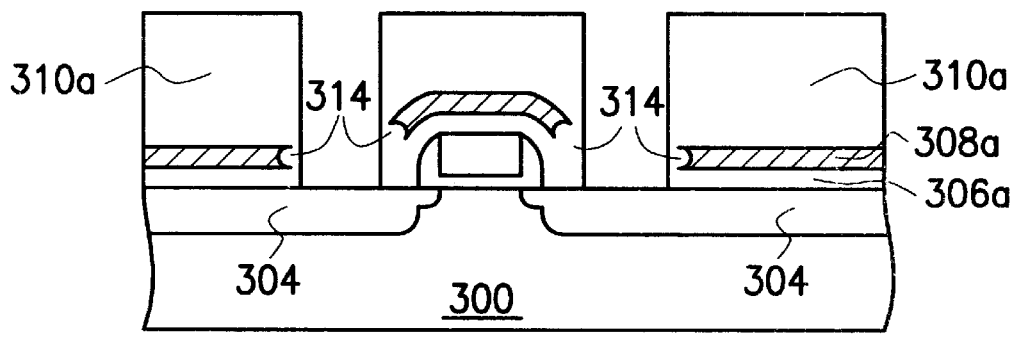

Thereafter, the ILD layer 310a and the insulating layer 306a are densified by heating. After densification, the recessed cavities 314 are sealed up by the ILD layer 310a and the insulating layer 306a as shown in FIG. 3D. Therefore, subsequently deposited conductive material inside the contact opening 312 cannot contact the conductive layer 308a directly. Finally, a conventional method is used to deposit conductive material into the contact opening 312, thereby forming a conductive layer that couples electrically with the doped region 304.

Figure 4:
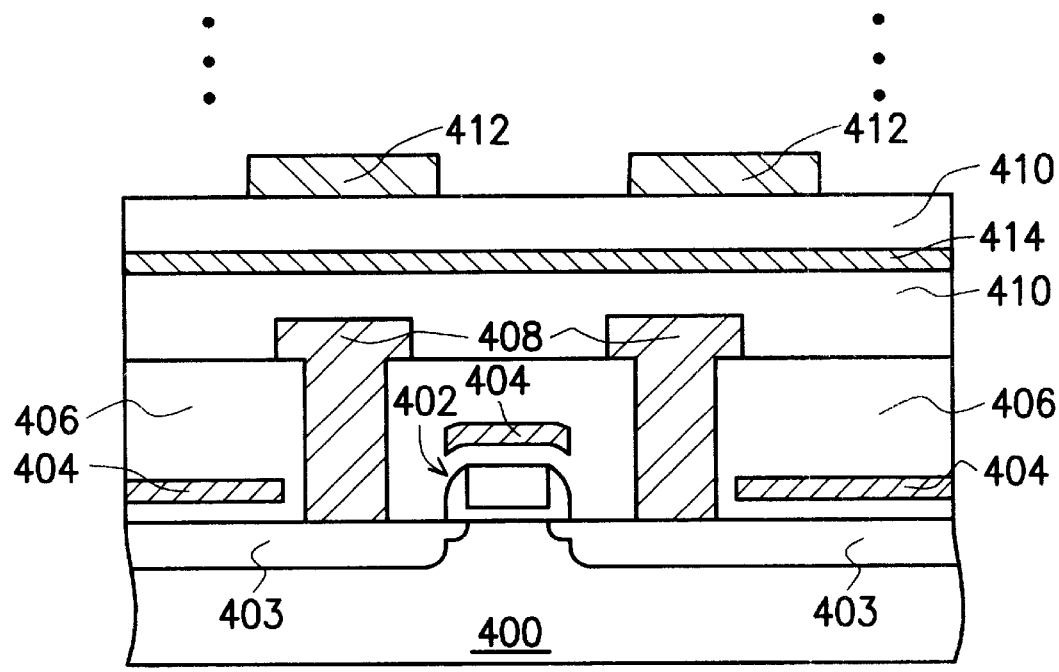
FIG. 4 is a cross-sectional view showing a device structure for preventing vertical cross talk between metallic layers according to the preferred embodiment of this invention.

FIG. 4 is a cross-sectional view showing a device structure for preventing vertical cross talk between metallic layers according to the preferred embodiment of this invention. The device structure includes, for example, a MOS device 402 over a substrate 400. The MOS device 402 has doped regions 403 in the substrate 400. A conductive layer 404 is formed above the MOS device 402, and the conductive layer 404 is isolated from other conductive layers by a dielectric layer 406. Furthermore, a contact (conductive layer) 408 that couples electrically with the doped region 403 is formed in the dielectric layer 406. In addition, another dielectric layer 410 having conductive layers 412 thereon is formed over the substrate 400. Between the conductive layer 412 and the contact (conductive layer) 408, a conductive layer 411 is formed inside the dielectric layer 410 using the method as shown in FIGS. 2A through 2D. The conductive layer 414 has no direct contact with other conductive layers. In is the presence of this conductive layer 414, electrical signals coming from the upper conductive layer 412 are shielded from the lower contact (conductive layer) 408 and vice versa. Hence, cross talk between the conductive layer 412 and the contact 408 is reduced to a minimum. Moreover, the above method can be applied to form multiple shielded conductive layers.

Figure 5:
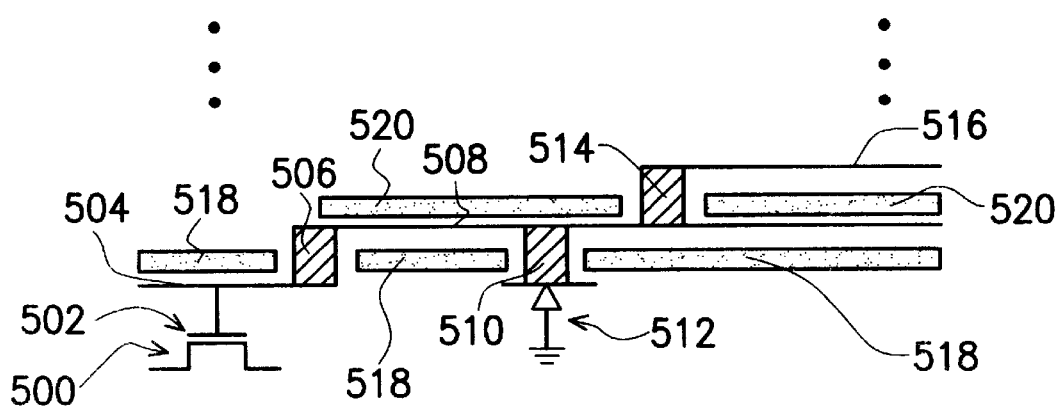
FIG. 5 is a circuit outline of this invention showing the protection device for preventing plasma damage and vertical cross talk.

FIG. 5 is a circuit outline of this invention showing the protection device for preventing plasma damage and vertical cross talk. In FIG. 5, the gate 502 of the MOS field effect transistor 500 is connected to a metal contact 506 through a polysilicon line 504. The metal contact 506 is connected to a second metal contact 510 having connection with a diode 512 and a third metal contact 514 through another polysilicon layer 508. The metal contact 514 in turn connects with another metallic line 516. The metallic layer 518 above the MOS device 500, besides preventing damage due to plasma charging, is an effective means of preventing cross talk between conductive layers. Moreover, the addition of a metallic layer 520 between different metallic line layers as shown in FIG. 5 minimizes vertical cross talk. Since no extra mask layer is required in the fabrication of these layers, the degree of difficulty in manufacturing the device is no greater.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A device manufacturing method capable of preventing damage due to plasma charging, the method comprising the steps of:

providing a substrate having a MOS device, wherein the MOS device has a source/drain region;

forming an insulating layer over the substrate, wherein the insulating layer is formed using a non-plasma operation;

forming a conductive layer and then an inter-layer dielectric layer over the substrate;

patterning the inter-layer dielectric layer, the conductive layer and the insulating layer to form a contact opening that exposes the source/drain region, wherein recessed cavities exposing the conductive layer are formed on the sidewalls of the contact opening when the conductive layer is patterned; and heating the substrate so that the inter-layer dielectric layer and the insulating layer densify and completely seal the recessed cavities.

2. The method of claim 1, wherein the step of forming the conductive layer includes depositing metallic material to form a metallic layer.

3. The method of claim 1, wherein the step of forming the insulating layer includes depositing oxide material to form an oxide layer.

4. The method of claim 1, wherein the step of patterning the conductive layer to form recessed cavities on the sidewalls of the contact opening includes using an isotropic etching method to remove a portion of the conductive layer.

5. The method of claim 1, wherein the step of patterning the inter-layer dielectric layer, the conductive layer and the insulating layer to form a contact opening further includes:

patterning the inter-layer dielectric layer, the conductive layer and the insulating layer using an anisotropic etching method to form a contact opening that exposes the source/drain region, wherein the contact opening has sidewalls that expose the conductive layer; and performing an isotropic etching of the conductive layer to form recessed cavities on the exposed conductive layer sidewalls.

6. The method of claim 1, wherein the step of patterning the inter-layer dielectric layer, the conductive layer and the insulating layer to form a contact opening further includes:

patterning the inter-layer dielectric layer using an anisotropic etching method;

performing an isotropic etching of the conductive layer to form recessed cavities on the exposed conductive layer sidewalls; and patterning the insulating layer using an anisotropic etching method to form a contact opening that exposes the source/drain region, wherein a portion of the contact opening exposes the conductive layer.

* * * * *